United States Patent
Cho

(10) Patent No.: US 11,088,221 B2
(45) Date of Patent: Aug. 10, 2021

(54) DISPLAY DEVICE INCLUDING A BLOCKING UNIT

(71) Applicant: SAMSUNG DISPLAY CO., LTD., Yongin-si (KR)

(72) Inventor: Yeonje Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/564,737

(22) Filed: Sep. 9, 2019

(65) Prior Publication Data

US 2020/0176518 A1 Jun. 4, 2020

(30) Foreign Application Priority Data

Dec. 4, 2018 (KR) .................. 10-2018-0154268

(51) Int. Cl.
*H01L 27/32* (2006.01)
*H01L 51/52* (2006.01)

(52) U.S. Cl.
CPC ........ *H01L 27/323* (2013.01); *H01L 27/3276* (2013.01); *H01L 51/5256* (2013.01)

(58) Field of Classification Search
CPC ............... H01L 27/323; H01L 51/5256; H01L 27/3276; H01L 27/3272
See application file for complete search history.

(56) References Cited

U.S. PATENT DOCUMENTS

| 2008/0055505 | A1 | 3/2008 | Yeh et al. | |
| 2011/0115365 | A1* | 5/2011 | Kwak | H01J 29/90 313/317 |
| 2014/0204285 | A1* | 7/2014 | Jang | G06F 3/0445 349/12 |
| 2016/0132148 | A1 | 5/2016 | Han et al. | |
| 2018/0040674 | A1* | 2/2018 | Du | G06F 3/04144 |

FOREIGN PATENT DOCUMENTS

| KR | 10-1135538 | 4/2012 |
| KR | 10-2016-0054664 | 5/2016 |
| KR | 10-2016-0070257 | 6/2016 |

* cited by examiner

*Primary Examiner* — Mark W Regn
(74) *Attorney, Agent, or Firm* — F. Chau & Associates, LLC

(57) ABSTRACT

Provided is a display device including a first substrate, a second substrate disposed on the first substrate and including a first surface and a second surface, a display unit disposed between the first substrate and the second substrate, a coupling unit disposed between the first substrate and the second substrate and coupled to the first substrate and the first surface of the second substrate, input sensing electrodes disposed on the second surface of the second substrate, signal lines disposed on the second surface of the second substrate and connected to the input sensing electrodes, sensing pads disposed on the second surface of the second substrate, overlapping the coupling unit in a plan view, and connected to the signals lines, and a blocking unit disposed on the second surface of the second substrate and spaced apart from the signals lines with the sensing pads interposed therebetween viewed in a plan view.

14 Claims, 12 Drawing Sheets

DISPLAY DEVICE INCLUDING A BLOCKING UNIT

CROSS-REFERENCE TO RELATED APPLICATIONS

This U.S. non-provisional patent application claims priority under 35 U.S.C. § 119 to Korean Patent Application No. 10-2018-0154268, filed on Dec. 4, 2018, the entire disclosure of which is incorporated by reference herein in its entirety.

TECHNICAL FIELD

The present invention relates to a display device, and more particularly, to a display device including a blocking unit.

DISCUSSION OF RELATED ART

A display device is a device for displaying images. Recently, organic light emitting diode (OLED) display devices are gaining traction. An OLED display device has the capacity to self illuminate when electrically connected and does not need a separate light producing source, unlike a liquid crystal display device; thus, the thickness and weight of an OLED display device may be comparatively reduced.

An organic light emitting device may include a first substrate, an OLED, a second substrate facing the first substrate and protecting the organic light emitting element, and a coupling unit including epoxy or frit seal for laminate-sealing the first substrate and the second substrate to each other.

In order to laminate-seal the first substrate and the second substrate, the coupling unit is interposed between the first substrate and the second substrate. The coupling unit is irradiated with laser light to cure the coupling unit and laminate-seal the first substrate and the second substrate.

SUMMARY

The present disclosure provides a display device with increased reliability.

An embodiment of the invention provides for a display device, including a first substrate, a second substrate disposed on the first substrate. The second substrate includes a first surface and a second surface opposite to the first surface. A display unit is disposed between the first substrate and the second substrate. A coupling unit is disposed between the first substrate and the second substrate. A plurality of input sensing electrodes are disposed on the second surface of the second substrate. A plurality of signal lines are disposed on the second surface of the second substrate. A plurality of sensing pads are disposed on the second surface of the second substrate, and at least partially overlap the coupling unit when viewed in a plan view, and are connected to the signals lines. A blocking unit is disposed on the second surface of the second substrate and spaced apart from the signals lines with the sensing pads interposed therebetween, when viewed in the plan view.

In an embodiment, the coupling unit is disposed between the blocking unit and the plurality of signal lines when viewed in the plan view.

In an embodiment, the sensing pads are spaced in a first direction, and the blocking unit has a length that extends primarily in the first direction.

In an embodiment, at least one ground pad is provided wherein the blocking unit is connected to the ground pad.

In an embodiment, the blocking unit comprises a first region and a second region adjacent to the first region, and a width of the first region is greater than a width of the second region when viewed in the plan view.

In an embodiment, the second region of the blocking unit faces the sensing pads.

In an embodiment, the coupling unit does not overlap the blocking unit when viewed in the plan view.

In an embodiment, at least one protruding portion protrudes from at least one end of the blocking unit to a first edge of the second substrate.

In an embodiment, the sensing pads are spaced in a first direction, and
the blocking unit comprises a first blocking unit extending primarily in the first direction and having a first end portion and a second end portion, a second blocking unit extending from the first end portion primarily in a second direction crossing the first direction, and a third blocking unit extending from the second end portion primarily in the second direction.

In an embodiment, at least one protruding portion protrudes from each of the first end portion and the second end portion of the blocking unit toward a first edge of the second substrate.

In an embodiment, at least one first protruding portion protrudes from the second blocking unit toward a second edge of the second substrate, and at least one second protruding portion protrudes from the third blocking unit toward a third edge of the second substrate.

In an embodiment, the first blocking unit comprises a first region and a second region, and a width of the first region is greater than a width of the second region when viewed in the plan view.

In an embodiment, the second region faces the sensing pads.

In an embodiment, the display unit comprises a display region and a non-display region adjacent to the display region, and the blocking unit at least partially overlaps the non-display region when viewed in the plan view.

In an embodiment, the input sensing electrodes include a first sensing electrode and a second sensing electrode, and the first sensing electrode includes first electrodes and at least one first connecting electrode that connects two adjacent first electrodes, and the second sensing electrode includes second electrodes and at least one second connecting electrode that connects two adjacent second electrodes, wherein the first connecting electrode and the second connecting electrode are disposed on different layers.

In an embodiment, the blocking unit is disposed on a same layer as the first connecting electrodes or the second connecting electrodes.

An embodiment of the present invention provides for a display device, including a first substrate, a second substrate facing the first substrate and including a first surface and a second surface opposite to the first surface. A coupling unit is disposed between the first substrate and the second substrate and coupled to the first substrate and the first surface of the second substrate. A plurality of input sensing electrodes are disposed directly on the second surface of the second substrate. A plurality of signal lines are disposed on the second surface of the second substrate and connected to the input sensing electrodes. A plurality of signal pads are disposed on the second surface of the second substrate, at least partially overlapping the coupling unit when viewed in a plan view, and include a plurality of sensing pads connected to the signals lines and at least one ground pad. A blocking unit is disposed directly on the second surface of the second substrate, spaced apart from the signals lines with the signal pads interposed therebetween when viewed in the plan view, and connected to the at least one ground pad.

In an embodiment, the blocking unit comprises a first region and a second region adjacent to the sensing pads, and a width of the first region is greater than a width of the second region when viewed in the plan view.

In an embodiment, the second region faces the sensing pads.

In an embodiment, at least one protruding portion protrudes from ends of the blocking unit to a first edge of the second substrate.

BRIEF DESCRIPTION OF THE FIGURES

The above and other aspects and features of the present disclosure will be more clearly understood from the following detailed description taken in conjunction with the accompanying drawings, in which.

DETAILED DESCRIPTION OF THE EMBODIMENTS

Figure 1:
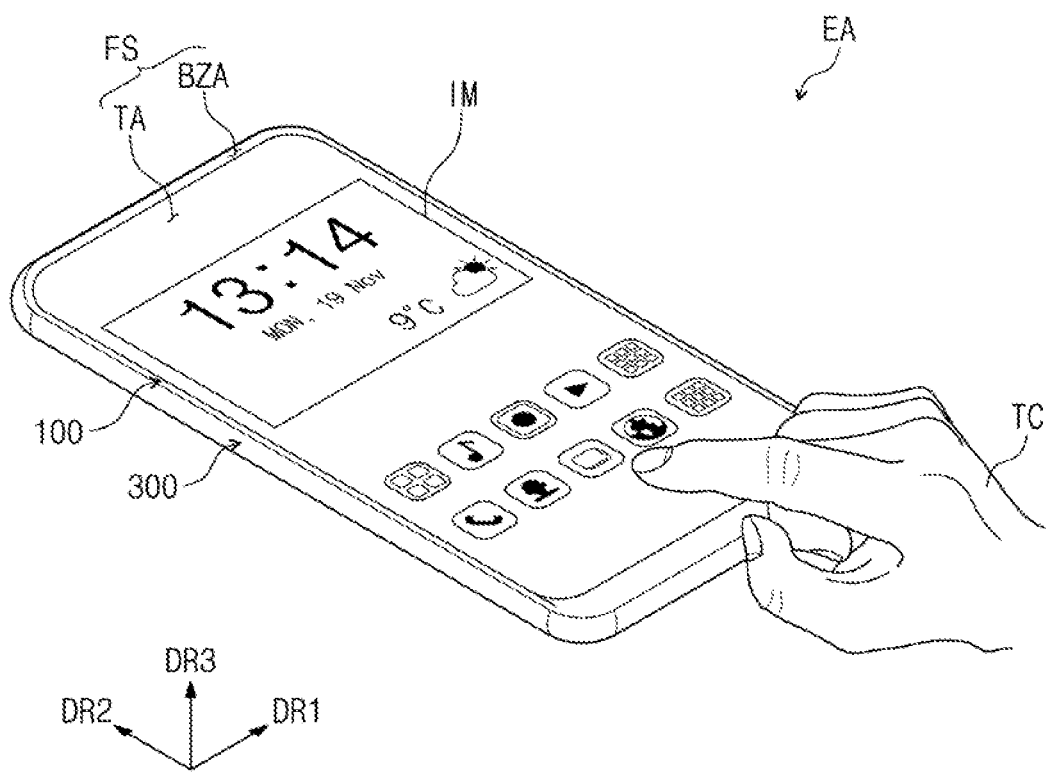
FIG. 1 is a perspective view illustrating a display device according to an exemplary embodiment of the present invention.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals may refer to like elements throughout the specification and drawings. Also, in the drawings, the thickness, the ratio, and the dimensions of elements may be exaggerated for an effective description of technical contents.

Figure 2:
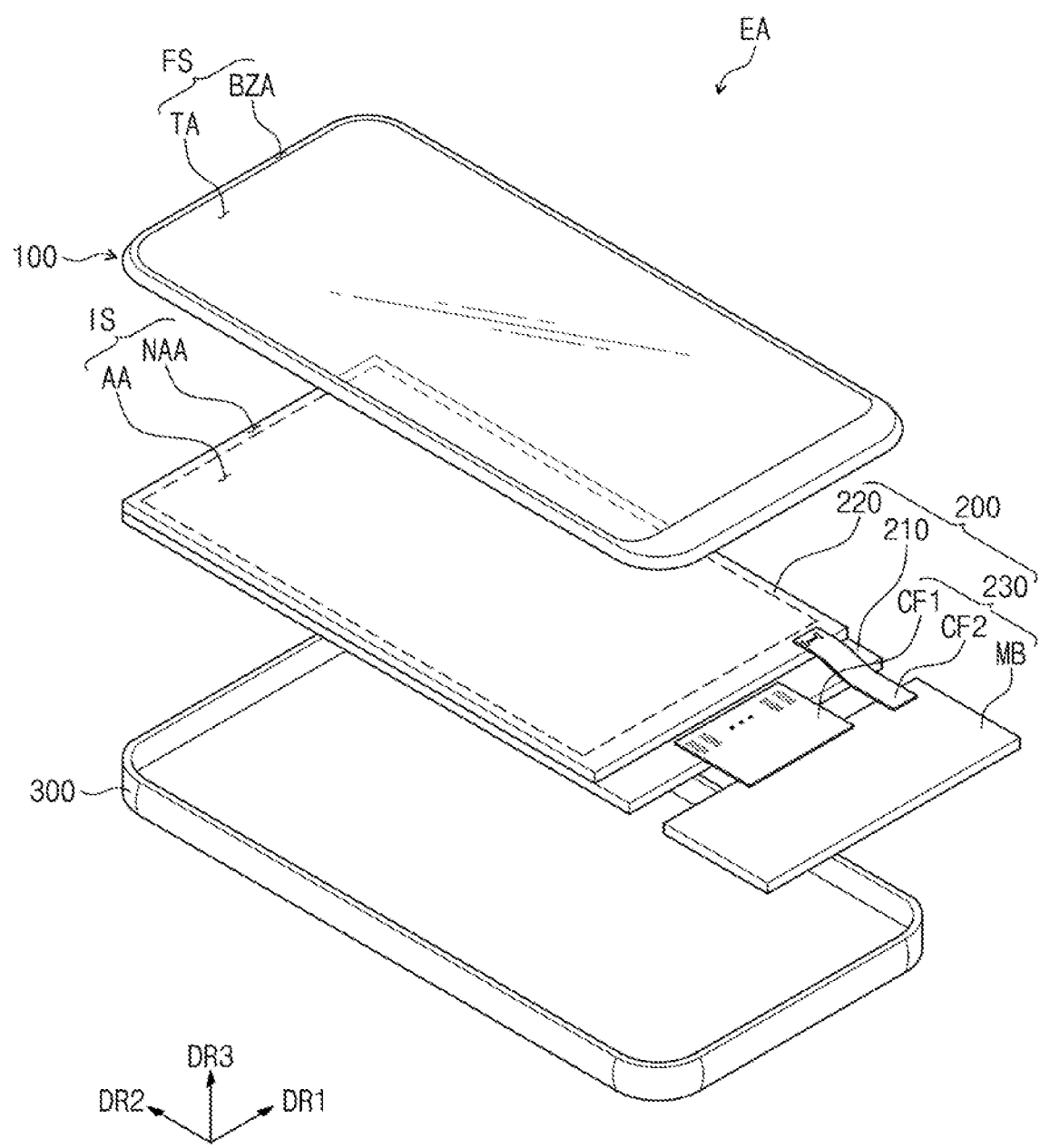
FIG. 2 is an exploded perspective view illustrating a display device according to an exemplary embodiment of the present invention.

FIG. 1 is a perspective view illustrating a display device according to an exemplary embodiment of the present invention, and FIG. 2 is an exploded perspective view illustrating a display device according to an exemplary embodiment of the present invention.

Referring to FIG. 1 and FIG. 2, a display device EA may be a smart phone activated by an electrical signal. However, the present invention is not limited thereto. The display device EA may include various embodiments. For example, the display device EA may include a tablet, a notebook computer, a smart television and the like. The display device EA may display an image IM on a front surface thereof. The front surface may be parallel to a plane defined by a first direction DR1 and a second direction DR2. The front surface may include a transmissive area TA and a bezel area BZA adjacent to and at least partially surrounding the transmissive area TA.

The display device EA may display the image IM on the transmissive area TA. The image IM may include a still image and/or a moving image. In FIG. 1, as an example of the image IM, a watch window and icons are illustrated.

The transmissive area TA may have a quadrangular shape including sides parallel to each of the first direction (e.g., the DR1 direction) and the second direction (e.g., the DR2 direction). For example, the transmissive area TA may have long sides that extend in second direction (e.g., the DR2 direction) and short sides that extend in the first direction (e.g., the DR1 direction). However, the invention is not limited thereto. The transmissive area TA may have various shapes, and is not limited to any particular embodiment.

The bezel area BZA may have a predetermined color. The bezel area BZA may include a region having a lower light transmittance relative to the transmissive area TA. The bezel area BZA may be disposed adjacent to the transmissive area TA. The bezel area BZA may form a rim around the display device EA at least partially surrounding the perimeter of the transmissive area TA. The bezel area BZA may define the shape of the transmissive area TA. The bezel area BZA may at least partially surround the transmissive area TA. Although the bezel area BZA is depicted as covering the entire perimeter of the display device EA in FIG. 1, the bezel area BZA may be disposed adjacent to fewer than all four sides of the display device EA (e.g., only one side of the transmissive area TA), or may be omitted altogether. The normal direction of the front surface may correspond to a third direction (e.g., a thickness direction DR3) of the display device EA. According to an exemplary embodiment of the present invention, a front surface (e.g., an upper surface) and a back surface (e.g., a lower surface) of each member may be defined on the basis of a direction in which the image IM is configured to be displayed. The front surface and the back surface may face each other and may be spaced in parallel in the third direction (e.g., the DR3 direction).

The display device EA, according to the present invention may sense an external input TC applied from the outside. The external input TC may include various forms of external inputs such as a part of a user's body (e.g., a user's finger), light, heat, or pressure. Also, the display device EA may sense not only an input contacting the display device EA, but also an input in close proximity therewith (e.g., hovering).

The display device EA may include a window 100, a display module 200, and an external case 300. The window 100 may be coupled to the external case 300.

Referring to FIG. 2, the window 100 may be disposed on the display module 200 to cover substantially an entire planar surface IS of the display module 200. The window 100 may include an optically transparent insulation material. For example, the window 100 may include a glass substrate, a sapphire substrate, and/or a plastic film. The window 100 may have a multi-layered structure or a single-layered structure. For example, the window 100 may have a laminated structure in which a plurality of plastic films are adhered to each other with an adhesive, or a laminated structure in which a glass substrate and a plastic film are adhered to each other with an adhesive.

The window 100 may include a front surface FS exposed to the outside. A front surface FS of the display device EA may be defined by the front surface FS of the window 100.

The display module 200 may display the image IM and sense the external input TC. The display module 200 may include the surface IS having a display area AA and a non-display area NAA. The display area AA may be a region activated by an electrical signal and displays an image.

The display area AA may be a region in which the image IM is displayed, and a region in which the external input TC is sensed. The transmissive area TA may overlap the display area AA. For example, the transmissive area TA may overlap the entire surface or at least a portion of the display area AA. Accordingly, a user may view the image IM through the transmissive area TA, and/or provide the external input TC. In the display area AA, a region in which the image IM is displayed and a region in which the external input TC is sensed may be separated from each other.

The non-display area NAA may be a region covered by the bezel area BZA. The non-display area NAA may be adjacent to the display area AA. The non-display area NAA may at least partially surround the display area AA. On the non-display area NAA, a driving circuit and/or a driving wiring may be disposed for driving the display area AA.

According to an exemplary embodiment of the present invention, the display module 200 may be assembled in a flat state in which the display area AA and the non-display area NAA face the window 100. For example, the surface IS of the display module 200 may be disposed facing a lower surface of the window 100. A portion of the non-display area NAA in the display module 200 may be bent. In this case, a bent portion of the non-display area NAA may face a back surface of the display device EA, so that the size of bezel area BZA of the display device EA may be reduced. Alternatively, the display module 200 may be assembled in a state in which a portion of the display area AA may also be bent. Alternatively, in the display module 200, according to an exemplary embodiment of the present invention, the non-display area NAA may be omitted.

The display module 200 may include a display panel 210, a sensing unit 220, and a driving circuit 230. The display panel 210 may be a component which generates the image IM. The image IM generated by the display panel 210 may be displayed on the entire surface IS by the transmissive area TA and visible to a user from the outside. The sensing unit 220 may sense the external input TC applied from the outside. The driving circuit 230 may be electrically connected to the display panel 210 and the sensing unit 220.

The driving circuit 230 may include a first circuit board CF1, a second circuit board CF2, and a main circuit board MB. The first circuit board CF1 may be electrically connected to the display panel 210. The first circuit board CF1 may connect to the display panel 210 at a first end and may connect to the main circuit board MB at a second end. According to an exemplary embodiment of the present invention the first circuit board CF1 may include a flexible circuit film. However, the present invention is not limited thereto. For example, the first circuit board CF1 might not be connected to the main circuit board MB, and the first circuit board CF1 may be a rigid substrate.

The first circuit board CF1 may be connected to pads (display pads) of the display panel 210 disposed on the non-display area NAA. The first circuit board CF1 may provide an electrical signal (e.g., a driving signal) to the display panel 210. The electrical signal provided by the circuit board CF1 may be generated from the first circuit board CF1 or by the main circuit board MB.

The second circuit board CF2 may be electrically connected to the sensing unit 220. According to an exemplary embodiment of the present invention, the second circuit board CF2 may include a flexible circuit film and may connect to the sensing unit 220 at a first end and to the main circuit board MB at a second end. However, the present invention is not limited thereto. For example, the second circuit board CF2 might not be connected to the main circuit board MB, and the second circuit board CF2 may include a rigid substrate.

The second circuit board CF2 may be connected to pads (e.g., display pads) of the sensing unit 220 disposed on the non-display area NAA. The second circuit board CF2 may provide an electrical signal (e.g., a driving signal) to the sensing unit 220. The electrical signal may be generated from the second circuit board CF2 or by the main circuit board MB.

The main circuit board MB may include various driving circuits for driving the display module 200 and/or connectors for supplying power. The first circuit board CF1 and the second circuit board CF2 may be connected to the main circuit board MB. However, the present invention is not limited thereto. For example, in the display module 200, according to an exemplary embodiment of the present invention, the display panel 210 and the sensing unit 220 may be connected to different main circuit boards MB, and either the first circuit board CF1 or the second circuit board CF2 might not be connected to the main circuit board MB.

According to an exemplary embodiment of the present invention, the first circuit board CF1 may be disposed further toward the center of a short side of the display panel relative to the second circuit board CF2 and may also have a greater planar area. The external case 300 may be disposed under the display module 200. The external case 300 together with the window 100 may defined the outward appearance of the display device EA. The external case 300 may include a relatively rigid material compared to the display module 200. According to an exemplary embodiment of the present invention, the external case 300 composed of a single body is exemplarily illustrated. However, the external case 300 may include a plurality of layers assembled together. For example, the external case 300 may include a plurality of frames and/or plates made of glass, plastic, and/or metal. The external case 300 may include an accommodation space of predetermined dimensions. For example, the accommodation space of the external case 300 may correspond to a shape of the display module 200 situated therein and may protect the display module 200 from external impact.

Figure 3:
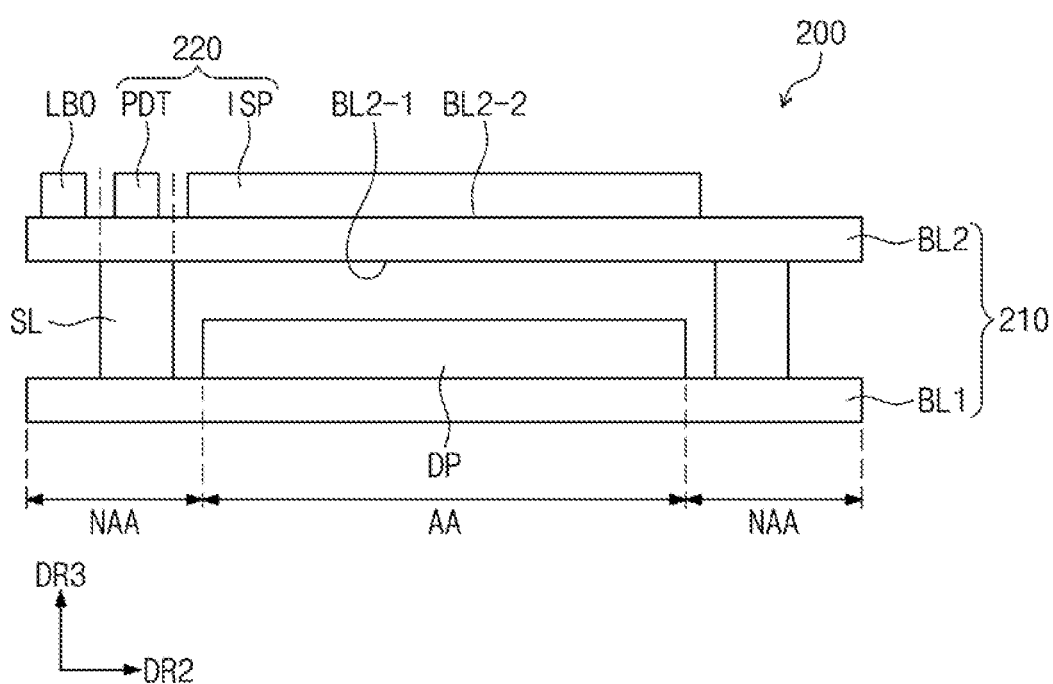
FIG. 3 is a cross-sectional view illustrating a display device according to an exemplary embodiment of the present invention.

FIG. 3 is a cross-sectional view of a display device according to an exemplary embodiment of the present invention.

Referring to FIG. 3, the display module 200 may include the display panel 210, the sensing unit 220, and a blocking unit LBO. The display panel 210 may be a component primarily responsible for generating the image IM. The display panel 210 may include a light receiving type display panel or a light emitting type display panel. The light receiving type display panel may include, for example, a liquid crystal display (LCD) panel. The light emitting type display panel may include, for example, an organic light emitting display panel including OLEDs and a quantum dot light emitting display panel. A light emitting layer of the organic light emitting display panel may include an organic light emitting material. A light emitting layer of the quantum dot light emitting display panel may include quantum dots, quantum rods, and the like. Hereinafter, the display panel 210 may be described as being an organic light emitting display panel.

The display panel 210 may include a first substrate BL1, a display unit DP, a second substrate BL2, and at least one coupling unit SL. The first substrate BL1 and the second substrate BL2 may each include, for example, a synthetic resin film. Each of the first substrate BL1 and the second substrate BL2 may include a glass substrate, and/or an organic/inorganic composite material substrate. Each of the first substrate BL1 and the second substrate BL2 may at least partially overlap both of the display area AA and the non-display area NAA.

The display unit DP may be disposed on the first substrate BL1. The display unit DP may include elements for displaying the image IM. The display area AA may coincide with an area of the display unit DP.

The second substrate BL2 may be disposed on the display unit DP. For example, the second substrate BL2 may be disposed in parallel to the first substrate BL1 and may be separated by at least one coupling unit SL disposed therebetween. The second substrate BL2 may include a light transmitting insulation substrate. The second substrate BL2 may be disposed on the first substrate BL1. The second substrate BL2 may include a first surface BL2-1 and a second surface BL2-2 facing the first surface BL2-1. The first surface BL2-1 may contact the at least one coupling unit SL and may face the first substrate BL1. The second surface BL2-2 may be a surface upon which the sensing unit 220 and the blocking unit LB0 may be disposed. The blocking unit LB0 may include indium zinc oxide (IZO), indium tin oxide (ITO), indium gallium oxide (IGO), indium zinc gallium oxide (IGZO), molybdenum (Mo), silver (Ag), titanium (Ti), copper (Cu), aluminum (Al), and/or an alloy thereof.

The coupling unit SL may be disposed between the first substrate BL1 and the second substrate BL2. For example, the coupling unit SL may be disposed between the first substrate BL1 and the first surface BL2-1 of the second substrate BL2. The coupling unit SL may be disposed on the non-display area NAA. When viewed in a plan view, the coupling unit SL might not overlap the display unit DP. When viewed in a plan view, the coupling unit SL may at least partially surround the display unit DP. The coupling unit SL may include an organic material such as frit seal. The coupling unit SL may be cured by irradiating it with laser light to seal the layer including the display unit DP together with the first substrate BL1 and the second substrate BL2.

The sensing unit 220 may include input sensing electrodes ISP and sensing pads PDT. The sensing unit 220 may sense the external input TC applied from the outside. For example, the sensing unit 220 may include a touch panel for sensing a touch applied from the outside. The input sensing electrodes ISP may be disposed on the second substrate BL2. For example, the input sensing electrodes ISP may be disposed on the second surface BL2-2 of the second substrate BL2 overlapping the active area AA. The input sensing electrodes ISP may obtain coordinate information of an external input to detect the location of an applied external input TC on the sensing unit 220. According to an exemplary embodiment of the present invention, the input sensing electrodes ISP may be disposed on one surface of the display panel 210. For example, the input sensing electrodes ISP may be integrated with the display panel 210 in an on-cell manner. The input sensing electrodes ISP may be formed in a continuous process while the display panel 210 is manufactured. However, the present invention is not limited thereto. For example, the input sensing electrodes ISP may be manufactured in a separate process from the display panel 210, and may be subsequently adhered to the display panel 210.

The sensing pads PDT may be disposed on the second substrate BL2. For example, the input sensing pads ISP may be disposed on the second surface BL2-2 of the second substrate BL2. Each of the sensing pads PDT may be connected to respective signals lines TL1, TL2, and TL3 (see FIG. 7) in a one-to-one correspondence, which is connected to the input sensing electrodes ISP. When viewed in a plan view, some of the sensing pads PDT may at least partially overlap the coupling unit SL. The sensing pads PDT may be electrically connected to the second circuit board CF2 to transmit and/or receive a signal to the main circuit board MB.

The blocking unit LB0 may be disposed on the first substrate BL2. For example, the blocking unit LB0 may be disposed on the second surface BL2-2 of the second substrate BL2. When viewed in a plan view, the blocking unit LB0 may be spaced apart from the signal lines TL1, TL2, and TL3 (see FIG. 7) with the sensing pads PDT interposed therebetween. When viewed in a plan view, the blocking unit LB0 may overlap the non-display area NAA. When viewed in a plan view, the blocking unit LB0 may be disposed on a lower end portion of the display device EA.

Figure 7:
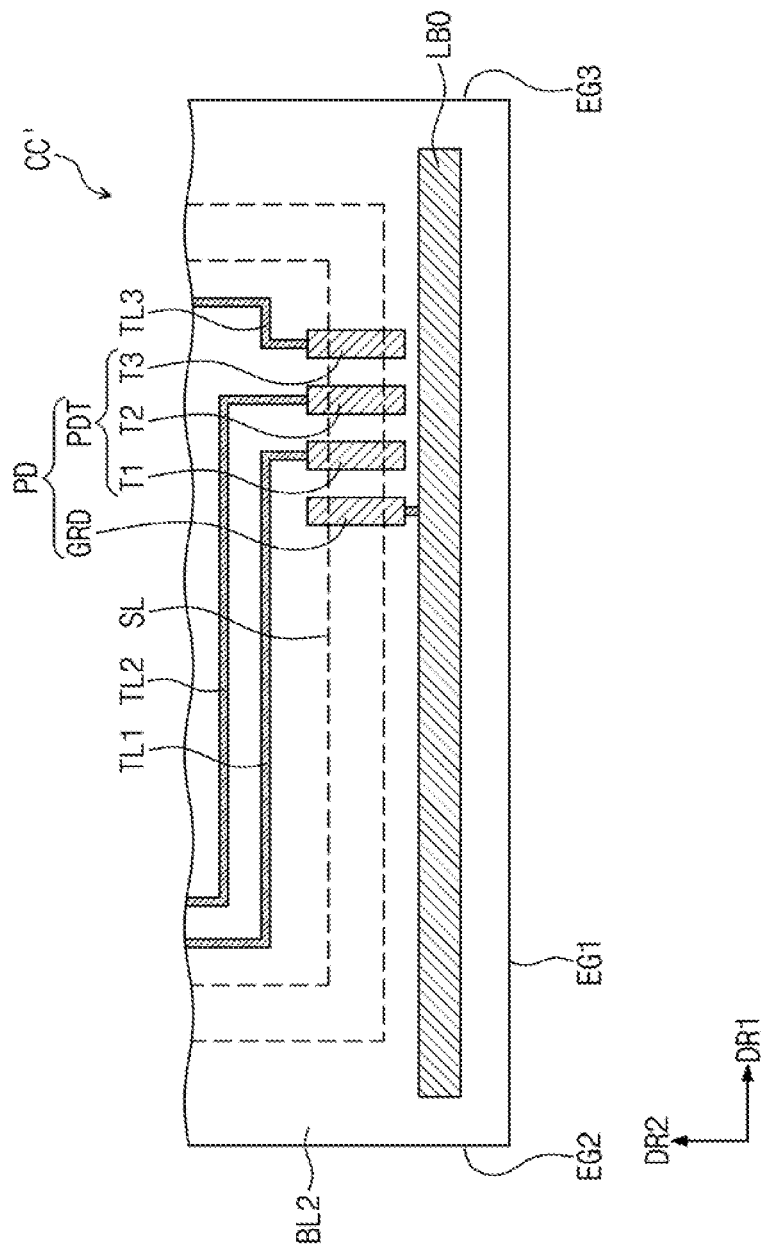
FIG. 7 is a plan view illustrating region CC' shown in FIG. 5, according to an exemplary embodiment of the present invention.

The blocking unit LB0 may be formed in the same manufacturing process as a process for forming the signal lines TL1, TL2, and TL3 (see FIG. 7). For example, the blocking unit LB0 and the signal lines TL1, TL2, and TL3 (see FIG. 7) may be formed through the same mask process.

The blocking unit LB0 may include indium zinc oxide (IZO), indium tin oxide (ITO), indium gallium oxide (IGO), indium zinc gallium oxide (IGZO), molybdenum (Mo), silver (Ag), titanium (Ti), copper (Cu), aluminum (Al), and/or an alloy thereof.

The blocking unit LB0 may block laser light from being irradiating regions other than the coupling unit SL. When the laser light irradiates regions of the display device EA other than the coupling unit SL, a side surface of the coupling unit SL may flow down causing damage to a layer constituting the display panel 210. The blocking unit LB0 may prevent a layer constituting the display panel 210, for example an organic film, from being damaged by the laser light. The blocking unit LB0 may be connected to a ground pad GRD (see FIG. 7). According to an exemplary embodiment of the present invention, static electricity introduced from the outside may be transferred to the ground pad GRD (see FIG. 7) through the blocking unit LB0. Since the blocking unit LB0 is spaced apart from the signal lines TL1, TL2, and TL3 (see FIG. 7), the static electricity may be prevented from damaging the signal lines TL1, TL2, and TL3 (see FIG. 7). The display device EA including the blocking unit LB0 may be provided with increased reliability.

Figure 4:
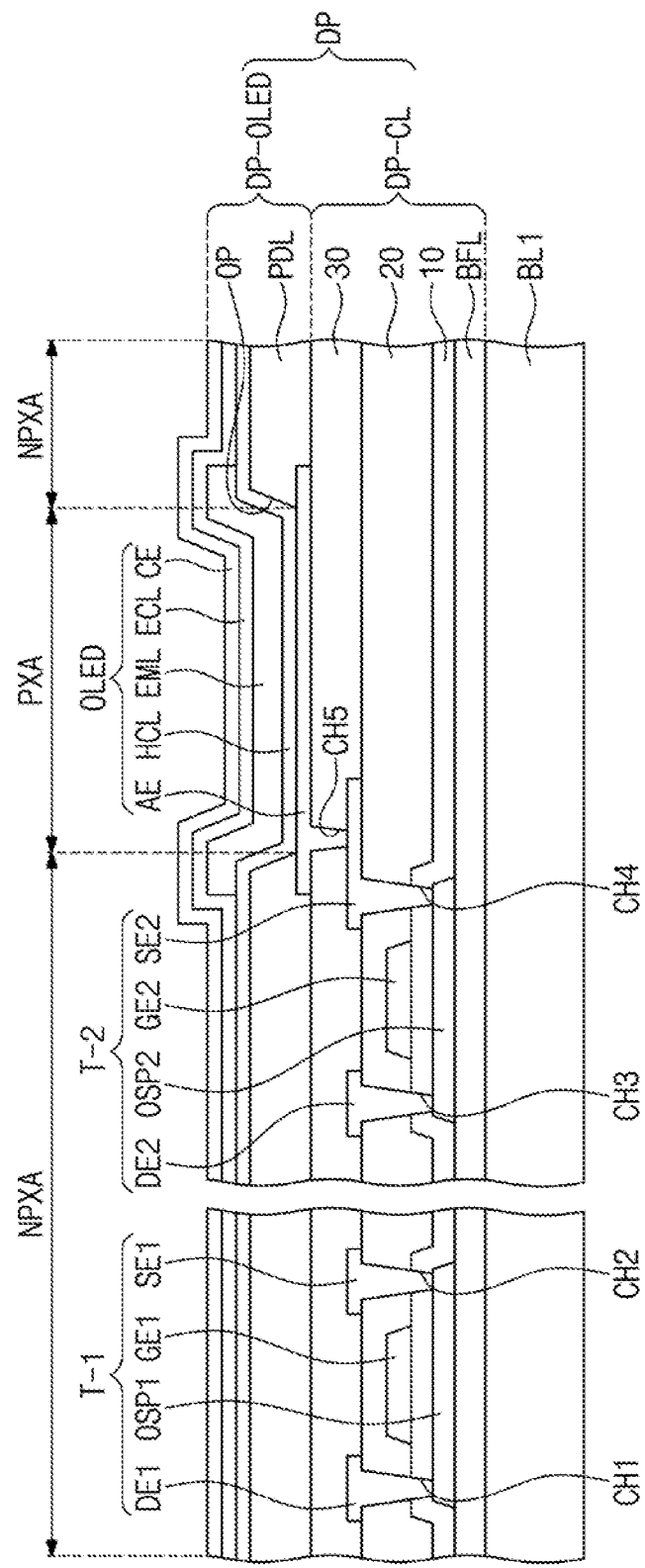
FIG. 4 is a cross-sectional view illustrating a portion of a display panel according to an exemplary embodiment of the present invention.

FIG. 4 is a cross-sectional view illustrating a portion of a display panel according to an exemplary embodiment of the present inventive concept.

Referring to FIG. 4, the display unit DP may be disposed on the first substrate BL1. The display unit DP may include a circuit element layer DP-CL and a display element layer DP-OLED. For example, on the first substrate BL1, the circuit element layer DP-CL and the display element layer DP-OLED may be sequentially disposed.

According to an exemplary embodiment of the present invention, the circuit element layer DP-CL may include a sequentially stacked buffer film BFL which is an inorganic film, a first intermediate inorganic film 10, a second intermediate inorganic film 20, and may include an intermediate organic film 30 which is an organic film. According to an exemplary embodiment of the present invention, the buffer film BFL may be omitted.

On the buffer film BFL, a first semiconductor pattern OSP1 of a first transistor T-1 and a second semiconductor pattern OSP2 of a second transistor T-2 may be disposed. The first semiconductor pattern OSP1 and the second semiconductor pattern OSP2 may be formed of amorphous silicon, polysilicon, and/or a metal oxide semiconductor.

The first intermediate inorganic film 10 may be disposed to at least partially cover the first semiconductor pattern OSP1 and the second semiconductor pattern OSP2. A first control electrode GE1 of the first transistor T-1 and a second control electrode GE2 of the second transistor T-2 may be disposed on the first intermediate inorganic film 10.

The second intermediate inorganic film 20 covering the first control electrode GE1 and the second control electrode GE2 may be disposed on the first intermediate inorganic film 10. A first input electrode DE1 and a first output electrode SE1 of the first transistor T-1 and a second input electrode DE2 and a second output electrode SE2 of the second transistor T-2 may be disposed on the first intermediate inorganic film 10.

The first input electrode DE1 and the first output electrode SE1 may be respectively connected to the first semiconductor pattern OSP1 through a first through-hole CH1 and a second through-hole CH2 passing through the first intermediate inorganic film 10 and the second intermediate inorganic film 20. The second input electrode DE2 and the second output electrode SE2 may be respectively connected to the second semiconductor pattern OSP2 through a third through-hole CH3 and a fourth through-hole CH4 passing through the first intermediate inorganic film 10 and the second intermediate inorganic film 20. According to an embodiment of the present invention, at least one of the first transistor T-1 and the second transistor T-2 may be implemented as a bottom gate structure.

The intermediate organic film 30 covering the first input electrode DE1, the second input electrode DE2, the first output electrode SE1, and the second output electrode SE2 may be disposed on the second intermediate inorganic film 20. The intermediate organic film 30 may be planarized to provide a flat surface.

The display element layer DP-OLED may be disposed on the intermediate organic film 30. The display element layer DP-OLED may include a pixel definition film PDL and an organic light emitting diode OLED. The pixel definition film PDL may include an organic material. A first electrode AE may be disposed on the intermediate organic film 30. The first electrode AE may be connected to the second output electrode SE2 through a fifth through-hole CH5 passing through the intermediate organic film 30. On the pixel definition film PDL, an opening OP may be defined. The opening OP of the pixel definition film PDL may expose at least a portion of the first electrode AE. According to an exemplary embodiment of the present invention, the pixel definition film PDL may be omitted.

The display area AA may include a light emitting area PXA, and a non-light emitting area NPXA disposed adjacent to the light emitting area PXA. For example, non-light emitting areas NPXA may be disposed at both sides of the light emitting area PXA when viewed in a cross-sectional view. The non-light emitting area NPXA may at least partially surround the light emitting area PXA. According to an exemplary embodiment of the present invention, the light emitting area PXA may have a width corresponding to substantially an entire width of the first electrode AE exposed by the opening OP.

According to an exemplary embodiment of the present invention, the light emitting area PXA may overlap at least one of the first and second transistors T-1 and T-2. The opening OP may be wider, and the first electrode AE and a light emitting layer EML, to be described later, may also be wider.

A hole control layer HCL may be commonly disposed in the light emitting area PXA and the non-light emitting area NPXA. The light emitting layer EML may be disposed on the hole control layer HCL. The light emitting layer EML may be disposed in a region corresponding to the opening OP. The light emitting layer EML may include an organic material and/or an inorganic material. The light emitting layer EML may generate a predetermined wavelength of light corresponding to a specific color or color band.

An electron control layer ECL may be disposed on the light emitting layer EML. A second electrode CE may be disposed on the electron control layer ECL.

According to an exemplary embodiment of the present invention, the organic light emitting diode OLED may further include a resonance structure for controlling the resonance distance of light generated in the light emitting layer EML. The resonance structure may be disposed between the first electrode AE and the second electrode CE, and the thickness of the resonance structure may be determined according to the wavelength of light generated in the light emitting layer EML.

Figure 5:
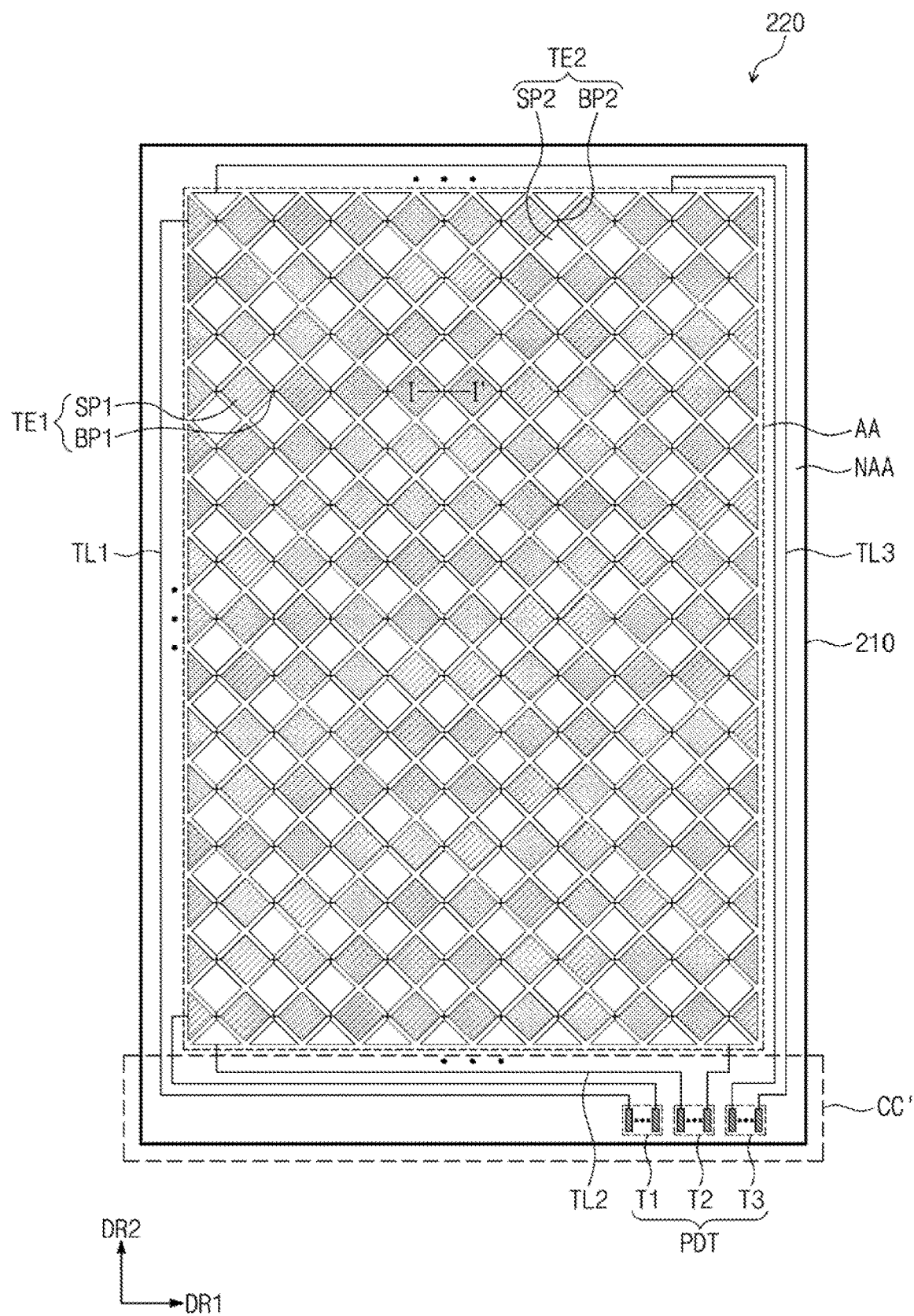
FIG. 5 is a plan view illustrating a portion of a sensing unit according to an exemplary embodiment of the present invention.
Figure 6:
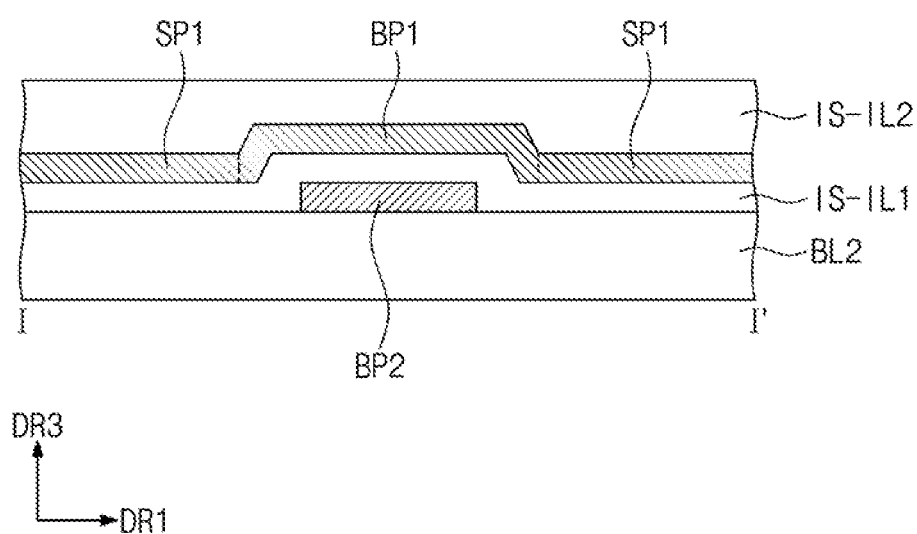
FIG. 6 is a perspective view illustrating a cross-section taken along line I-I' shown in FIG. 5 according to an exemplary embodiment of the present invention.

FIG. 5 is a plan view illustrating a portion of a sensing unit according to an exemplary embodiment of the present invention, and FIG. 6 is a perspective view illustrating a cross-section taken along line I-I' shown in FIG. 5, according to an exemplary embodiment of the present invention.

Referring to FIG. 5, the sensing unit 220 may be disposed on the display panel 210. For example, the sensing unit 220 may have a smaller planar area in a plan view relative to the display panel 210, such that at least one edge of the display panel 210 is exposed (i.e., not overlapped). The sensing unit 220 may include the input sensing electrodes ISP, a plurality of signal lines TL1, TL2, and TL3, and a plurality of sensing pads PDT.

The input sensing electrodes ISP may include a first sensing electrode TE1 and a second sensing electrode TE2. The first sensing electrode TE1 may include first electrodes SP1 and first connecting electrodes BP1. At least one first connecting electrode BP1 may connect to two first electrodes SP1 disposed adjacent to each other. For example, the first electrodes SP1 may be disposed in rows extending in the first direction (e.g., the DR1 direction) and the first connecting electrode BP1 may be disposed between consecutive first electrodes SP1 disposed in a same row. The second sensing electrode TE2 may include second connecting electrodes SP2 and second connecting electrodes BP2.

At least one second connecting electrode BP2 may be connected to two second electrodes SP2 disposed adjacent to each other. For example, the second electrodes SP2 may be disposed in columns extending in the second direction (e.g., the DR2 direction) and the second connecting electrode BP2 may be disposed between consecutive second electrodes SP2 disposed in a same column.

The first sensing electrode TE1 and the second sensing electrode TE2 may be disposed on the display area AA. For example, the planar area of the matrix comprising the first sensing electrode TE1 and the second sensing electrode TE2 may substantially conform to the planar area bounded by the display area AA when viewed in a plan view. The sensing unit 220 may obtain information on an external input TC applied by a user through a change in capacitance between the first sensing electrode TE1 and the second sensing electrode TE2.

The signal lines TL1, TL2, and TL3 may be disposed on the non-display area NAA. The signal lines TL1, TL2, and TL3 may include first signal lines TL1, second signals lines TL2, and third signal lines TL3. Each of the first signal lines TL1 may be connected to respective first electrodes SP1 in a one-to-one correspondence at a first end, and may have a second end connected to the first sensing pad T1. Each of the second signal lines TL2 may be connected to ends of respective second electrodes SP2 at a first end in a one-to-one correspondence, and may be connected to the second sensing pad T2 at a second end. Each of the third signal lines TL3 may be connected to the second electrodes SP2 in a one-to-one correspondence at a first end, and may have a second end connected to the third sensing pads T3. The other ends of the second electrodes SP2 may be portions facing the one ends of the second electrodes SP2. According to an exemplary embodiment of the present invention, the third signal lines TL3 may be omitted. The sensing pads PDT may be disposed on the non-display area NAA in the region CC' demarcated by the dotted rectangle. The sensing pads PDT may include first sensing pads T1, second sensing pads T2, and third sensing pads T3. Each of the first sensing pads T1 may be connected to each of the first signals lines TL1 in a one-to-one correspondence to provide an external signal to the first sensing electrodes TE1. Each of the second sensing pads T2 may be connected to each of the second signals lines TL2 in a one-to-one correspondence to provide an external signal to the first sensing electrodes TE1. Each of the third sensing pads T3 may be connected to each of the third signals lines TL3 in a one-to-one correspondence to be electrically connected to the second sensing electrode TE2 and provide an external signal thereto.

Referring to FIG. 6, the second connecting electrodes BP2 may be disposed on the second substrate BL2. A first insulation layer IS-IL1 may be disposed at least partially covering the second substrate BL2 and the second connecting electrodes BP2. The first electrodes SP1 and the first connecting electrodes BP1 may be disposed on an upper surface of the first insulation layer IS-IL1. A second insulation layer IS-IL2 may be disposed at least partially covering the first electrodes SP1 and the first connecting electrodes BP1. The blocking unit LB0 may be disposed on a same layer as either of the first connecting electrode BP1 and the second connecting electrode BP2. The first connecting electrodes BP1 may at least partially overlap the second connecting electrodes BP2 when viewed in plan and cross sectional views.

The second connecting electrodes BP2 may be disposed under the first connecting electrodes BP1 and the first electrodes SP1 with the first insulation layer IS-IL1 disposed therebetween. The second connecting electrodes BP2 may be disposed between adjacent first electrodes SP1 when viewed in plan and cross sectional views. The first connecting electrode BP1 may have a bridge shape in a cross-sectional view including an elevated portion extending in the first direction (e.g., the DR1 direction) and support portions extending in an axis formed between the third (e.g., the DR3 direction) and first direction (e.g., the DR1 direction), each of which may be attached to the first electrodes SP1 at a first end and an end of the elevated portion of the first connecting electrode at a second end. The first connecting electrode BP1 may be disposed between adjacent first electrodes SP1 and may overlie the second connecting electrode BP2.

FIG. 7 is a plan view illustrating region CC' shown in FIG. 5, according to an exemplary embodiment of the present invention.

Referring to FIG. 7, the signal lines TL1, TL2, and TL3, a signal pad PD, and the blocking unit LB0 may be disposed on the second surface BL2-2 of the second substrate BL2. The signal pad PD may include the sensing pads PDT and at least one ground pad GRD. On the first surface BL2-1 of the second substrate BL2, the coupling unit SL may be disposed. When viewed in a plan view, a portion of the signal PD may overlap the coupling unit SL. The coupling unit SL, when viewed in a plan view, may form two closed line rectangular shapes of different perimeter sizes. For example, the coupling unit SL may include a first and second rectangular shape with corresponding sides disposed in parallel to one another. However, the present invention is not limited thereto. For example, the space between parallel dotted lines of the coupling unit SL may represent an area occupied by the coupling unit SL (e.g., a thickness thereof).

The second substrate BL2 may include a first edge EG1, a second edge EG2, and a third edge EG3. The first edge EG1 may have a side of the second substrate BL2 extending in the first direction (e.g., the DR1 direction). The second edge EG2 and the third edge EG3 may be disposed in parallel and may have sides of the second substrate BL2 extending in the second direction (e.g., the DR2 direction). The second edge EG2 and the third edge EG3 may face each other by being spaced apart in the first direction DR1.

The sensing pads PDT may be arranged by being spaced apart at a predetermined distance in the first direction (e.g., the DR1 direction). For example, the sensing pads PDT may be arranged with a uniform spacing between consecutive pads, but the invention is not limited thereto. The sensing pads PDT may include the first sensing pads T1, the second sensing pads T2, and the third sensing pads T3. In FIG. 7, one first sensing pad T1, one second sensing pad T2, and one third sensing pad T3 are illustrated.

The ground pad GRD may be disposed between two of the first to third sensing pads T1, T2, and T3, or may be disposed adjacent to a side of at least one of the first to third sensing pads T1-T3 of the sensing pads PDT. According to an exemplary embodiment of the present invention, the ground pad GRD may be provided in a plurality.

The blocking unit LB0 may include a length extending in the first direction (e.g., the DR1 direction) and a width extending in the second direction (e.g., the DR2 direction). The blocking unit LB0 may be spaced apart in the second direction DR2 from each of the signal lines TL1, TL2, and TL3 with the sensing pads PDT interposed therebetween. In FIG. 7, the signal lines TL1, TL2, and TL3 are each represented by a single line for convenience of illustration. However, the present invention is not limited thereto. For example, the signal lines TL1-TL3 may each be bent upon themselves to give the appearance of multiple lines when viewed in a plan view, or may be provided in plural.

The coupling unit SL may be disposed between the blocking unit LB0 and the signal lines TL1, TL2, and TL3 adjacent to an edge (e.g., the first edge EG1) of the second substrate BL2 and may be disposed with a length parallel thereto. Since the blocking unit LB0 may be spaced apart from the signal lines TL1, TL2, and TL3, static electricity may be prevented from damaging the signal lines TL1, TL2, and TL3. Also, the blocking unit LB0 may be connected to the ground pad GRD. According to the inventive concept, static electricity introduced from the outside may be transferred to the ground pad GRD through the blocking unit LB0. Accordingly, the display device EA with improved reliability may be provided.

Figure 8:
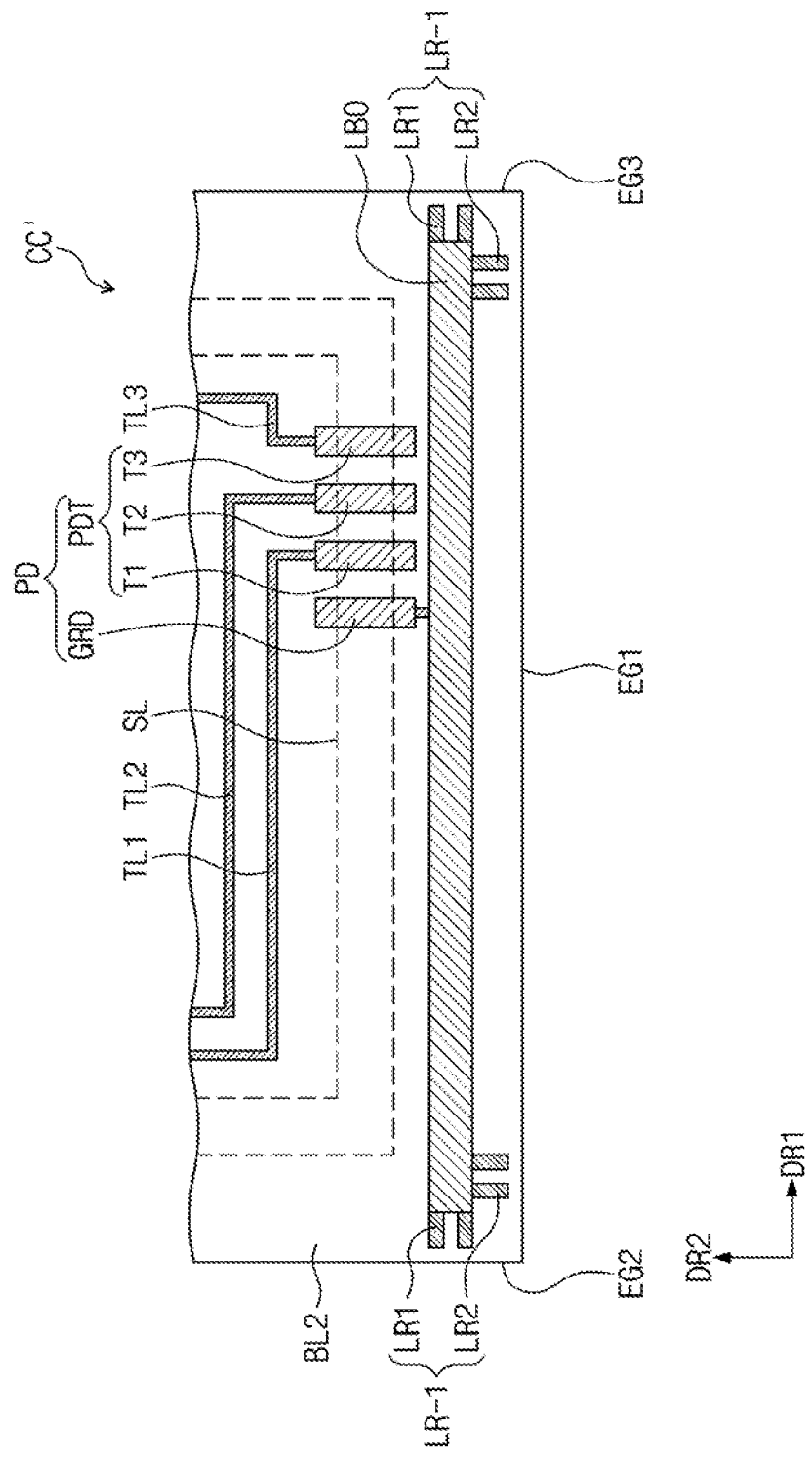
FIG. 8 is a plan view illustrating region CC' shown FIG. 5, according to an exemplary embodiment of the present invention.

FIG. 8 is a plan view illustrating a region corresponding to region CC' shown in FIG. 5 according to an exemplary embodiment of the present invention. The same reference numerals may be given to common elements described with reference to FIG. 7, and may be omitted for brevity of description.

Referring FIG. 8, the display device EA may include a blocking unit LB0 having at least one protruding portion LR-1. The protruding portion LR-1 may include a first protruding portion LR1 and a second protruding portion LR2 that may be substantially a same length as one another. The protruding portion LR-1 may be singular or may be provided in plurality. For example, the protruding portion LR-1 may be spaced apart along a span of a side surface of the blocking unit LB0 (e.g., a surface extending in the DR1 direction and facing the first edge EG1) at a predetermined distance.

The first protruding portion LR1 may protrude in the first direction (e.g., the DR1 direction) from at least one end (e.g., a short side of the extending in the DR2 direction) of the blocking unit LB0 toward the second edge EG2 and/or the third edge EG3. The second protruding portion LR2 may protrude in the second direction (e.g., the DR2 direction) from the blocking unit LB0 toward the first edge EG1. Although the protruding portion LR-1 is shown as a rectangular protrusion, the present invention is not limited thereto and may include, for example, a semicircular shape (e.g., a loop) with ends connected to the blocking unit LB0. However, the protruding portion LR-1 may be provided in a variety of shapes and is not limited thereto. For example, the protruding portion LR-1 may be provided as a line with multiple interconnected segments extending substantially in the first direction (e.g., the DR1 direction), the second direction (e.g., the DR2 direction), a thickness direction (e.g., the third direction DR3 penetrating more than one layer) and/or an axis formed therebetween. The protruding portion LR-1 may at least partially surround two edges (e.g., the first edge EG1 and the second edge EG2). According to an exemplary embodiment of the present invention, when a pair of protruding portions LR-1 are provided, constituent protruding regions LR-1 may be connected by a line formed of similar material disposed therebetween.

The protruding portion LR-1 may be made of the same material as the blocking unit LB0. The protruding portion LR-1 may serve analogously to a lightning rod with respect to receiving and offsetting electrical forces. According to the present invention, static electricity introduced from the outside may be transferred to the blocking unit LB0 through the protruding portion LR-1. The static electricity transferred to the blocking unit LB0 may be transferred to the ground pad GRD. Since the blocking unit LB0 is spaced apart from the signal lines TL1, TL2, and TL3, the static electricity may be prevented from damaging the signal lines TL1, TL2, and TL3. Accordingly, the display device EA with increased reliability may be provided.

Figure 9:
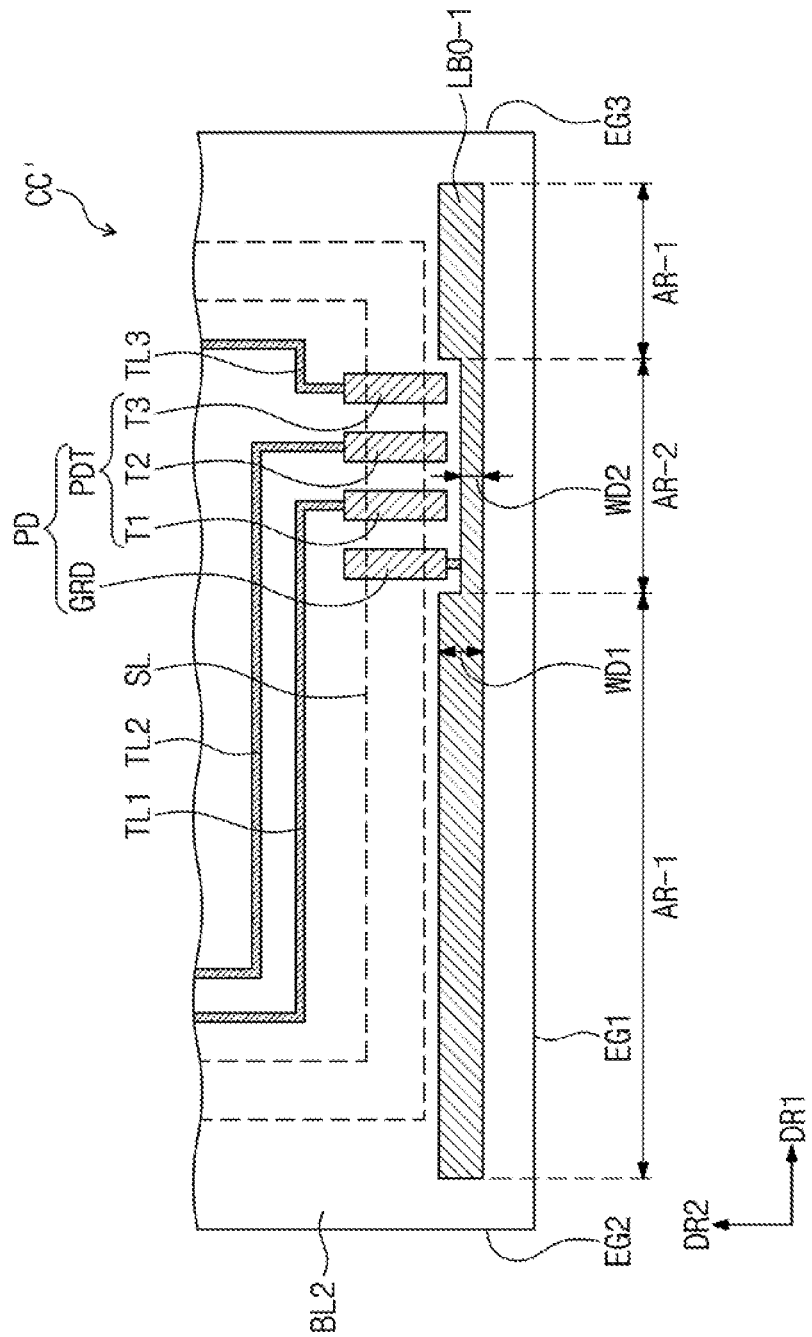
FIG. 9 is a plan view illustrating region CC' shown FIG. 5, according to an exemplary embodiment of the present invention.

FIG. 9 is a plan view illustrating a region corresponding to region CC' shown in FIG. 5, according to an exemplary embodiment of the present invention. The same reference numerals may be given to common elements described with reference to FIG. 7 and FIG. 8, and repetitive descriptions may be omitted for brevity of description.

Referring to FIG. 9, a blocking unit LB0-1 may include a first region AR-1 and a second region AR-2 adjacent to the first region AR-1. A width WD1 of the first region AR-1 may be greater than a width WD2 of the second region AR-2. The width WD1 of the first region AR-1 and the width WD2 of the second region AR-2 may be widths in the second direction (e.g., the DR2 direction). The second region AR-2 may face the sensing pads PDT.

The blocking unit LB0-1 may be spaced apart from the signal lines TL1, TL2, and TL3 with the sensing pads PDT interposed therebetween. Between the blocking unit LB0-1 and the signal lines TL1, TL2, and TL3, the coupling unit SL may be disposed. When viewed in a plan view, the blocking unit LB0-1 might not overlap the coupling unit SL. The blocking unit LB0-1 may be connected to the ground pad GRD.

The blocking unit LB0-1 may accommodate an area of a region in which the signal pad PD is disposed due to the difference between the width WD1 of the first region AR-1 and the width WD2 of the second region AR-2. Accordingly, even when the blocking unit LB0-1 of the display device EA is included, an increase in the area of the non-display area NAA may be minimized. Additionally, the first region AR-1 may at least partially surround a lower end of the signal pad PD, when viewed in a plan view. For example, the width WD1 of the first region AR-1 of the blocking unit LB0-1 may at least partially surround a side surface (e.g., a surface extending in the DR2 direction) of the lower end of the signal pad PD. However, the present invention is not limited thereto. For example, an edge of the width WD1 facing the coupling unit SL may be substantially aligned with an end surface of the signal pad PD.

Figure 10:
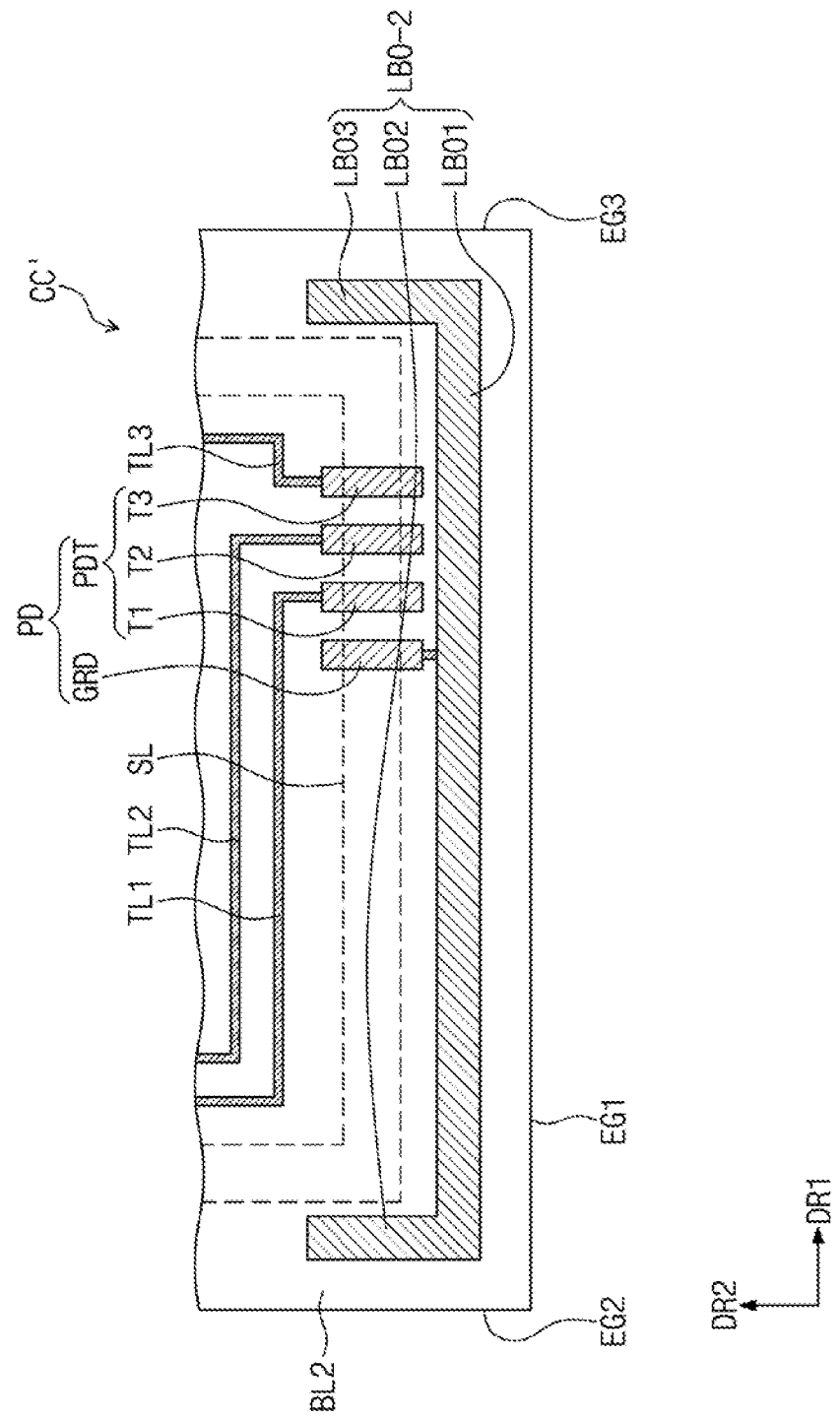
FIG. 10 is a plan view illustrating region CC' shown FIG. 5, according to an exemplary embodiment of the present invention.

FIG. 10 is a plan view illustrating a region corresponding to region CC' shown in FIG. 5, according to an exemplary embodiment of the present invention. The same reference numerals may be given to the elements described with reference to FIG. 7 to FIG. 9, and redundant descriptions thereof may be omitted for brevity.

Referring to FIG. 10, a blocking unit LB0-2 may include a first blocking unit LB01, and at least one of a second blocking unit LB02, and a third blocking unit LB03. The first blocking unit LB01 may extend in the first direction (e.g., the DR1 direction). The second blocking unit LB02 may extend in the second direction (e.g., the DR2 direction) from a first end portion of the first blocking unit LB01. The third blocking unit LB03 may extend in the second direction (e.g., the DR2 direction) from a second end portion of the first blocking unit LB01. The first end portion may be one end of the first blocking unit LB01, and the second end portion may be the other end of the first blocking unit LB01. The first end portion and the second end portion of the blocking unit LB0-2 may be substantially the same length in the second direction (e.g., the DR2 direction) or may be different shapes and/or height from one another. For example, when viewed in a plan view, the first end portion may have a different extension length in the second direction (e.g., the DR2 direction) than the extension length of the second end portion in the same direction.

The first blocking unit LB01 may be spaced apart from the signal lines TL1, TL2, and TL3 in the second direction DR2 with the sensing pads PDT interposed therebetween. Between the first blocking unit LB01 and the signal lines TL1, TL2, and TL3, the coupling unit SL may be disposed. When viewed in a plan view, the blocking unit LB0-2 might not overlap the coupling unit SL. The blocking unit LB0-2 may be connected to the ground pad GRD. Static electricity introduced from the outside may be transferred through the second blocking unit LB02 and the third blocking unit LB03. According to the present invention, static electricity introduced from the outside may be transferred to the ground pad GRD through the blocking unit LB0-2. Since the blocking unit LB0-2 is spaced apart from the signal lines TL1, TL2, and TL3, the static electricity may be prevented from damaging the signal lines TL1, TL2, and TL3. Accordingly, the display device EA with increased reliability may be provided.

Figure 11:
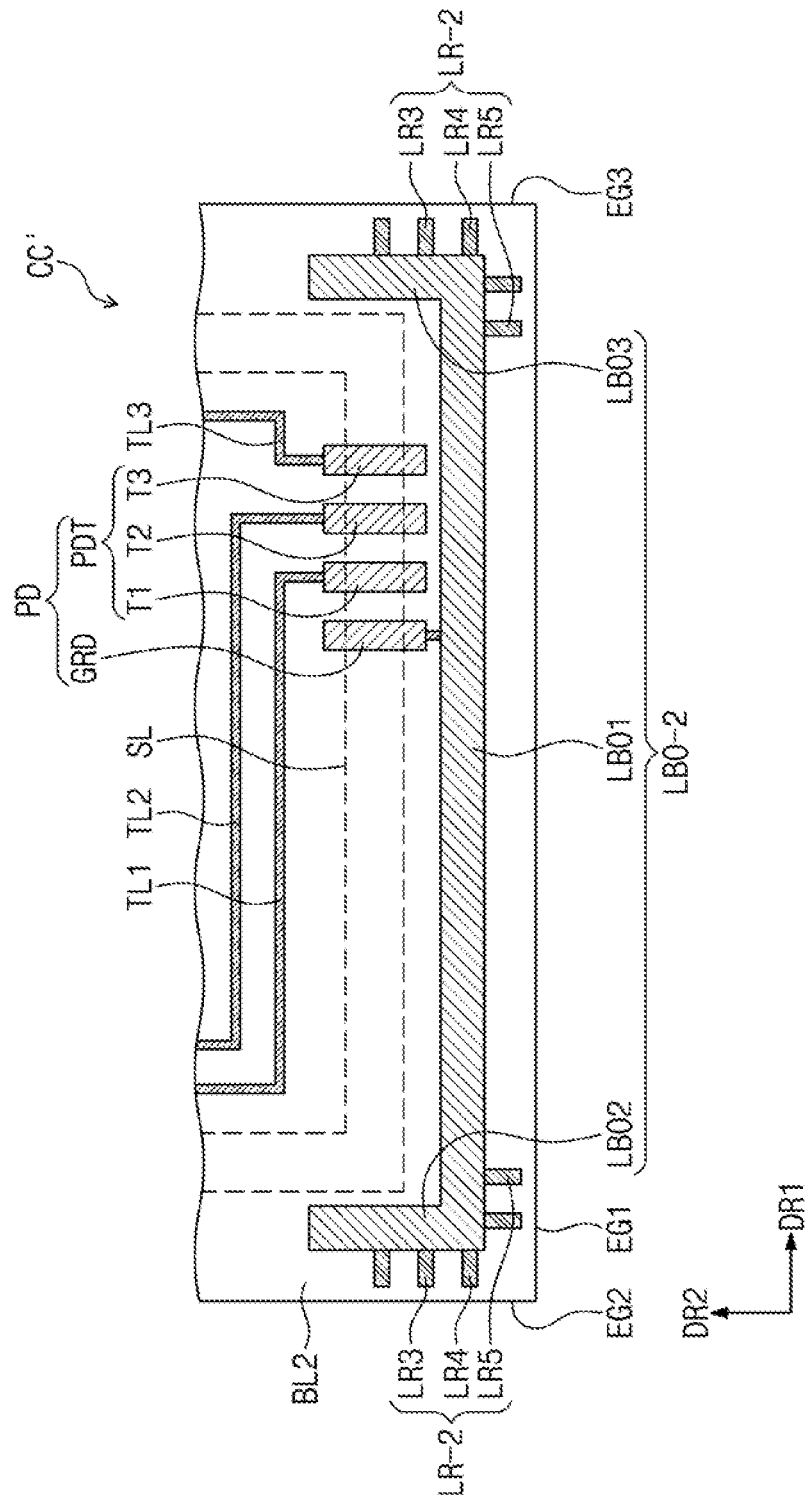
FIG. 11 is a plan view illustrating region CC' shown FIG. 5 according to an exemplary embodiment of the present invention.

FIG. 11 is a plan view illustrating a region corresponding to region CC' shown in FIG. 5, according to an exemplary embodiment of the present invention. The same reference numerals may be given to the elements described with reference to FIG. 7 to FIG. 10, and redundant descriptions thereof may be omitted for brevity.

Referring FIG. 11, the display device EA may further include a blocking unit LB0-2. The blocking unit LB0-2 may include a protruding portion LR-2. The protruding portion LR-2 may include a first protruding portion LR3, a second protruding portion LR4, and a third protruding portion LR5.

The first protruding portion LR3 may protrude in the first direction (e.g., the DR1 direction) from the second blocking unit LB0-2 toward the second edge EG2. Also, the first protruding portion LR3 may protrude in the first direction (e.g., the DR1 direction) from the third blocking unit LB03 toward the third edge EG3.

The second protruding portion LR4 may protrude in the first direction (e.g., the DR1 direction) from both ends of the first blocking unit LB01 toward the second edge EG2 and/or the third edge EG3.

The third protruding portion LR5 may protrude in the second direction DR2 from at least one end of the first blocking unit LB01 toward the first EG1.

The protruding portion LR-2 may be made of the same material as the blocking unit LB0-2. The protruding portion LR-2 may serve as a lightning rod. According to the inventive concept, static electricity introduced from the outside may be transferred to the blocking unit LB0-2 through the protruding portion LR-2. The static electricity transferred to the blocking unit LB0-2 may be transferred to the ground pad GRD. Since the blocking unit LB0-2 is spaced apart from the signal lines TL1, TL2, and TL3, the static electricity may be prevented from damaging the signal lines TL1, TL2, and TL3. Accordingly, the display device EA with increased reliability may be provided.

Figure 12:
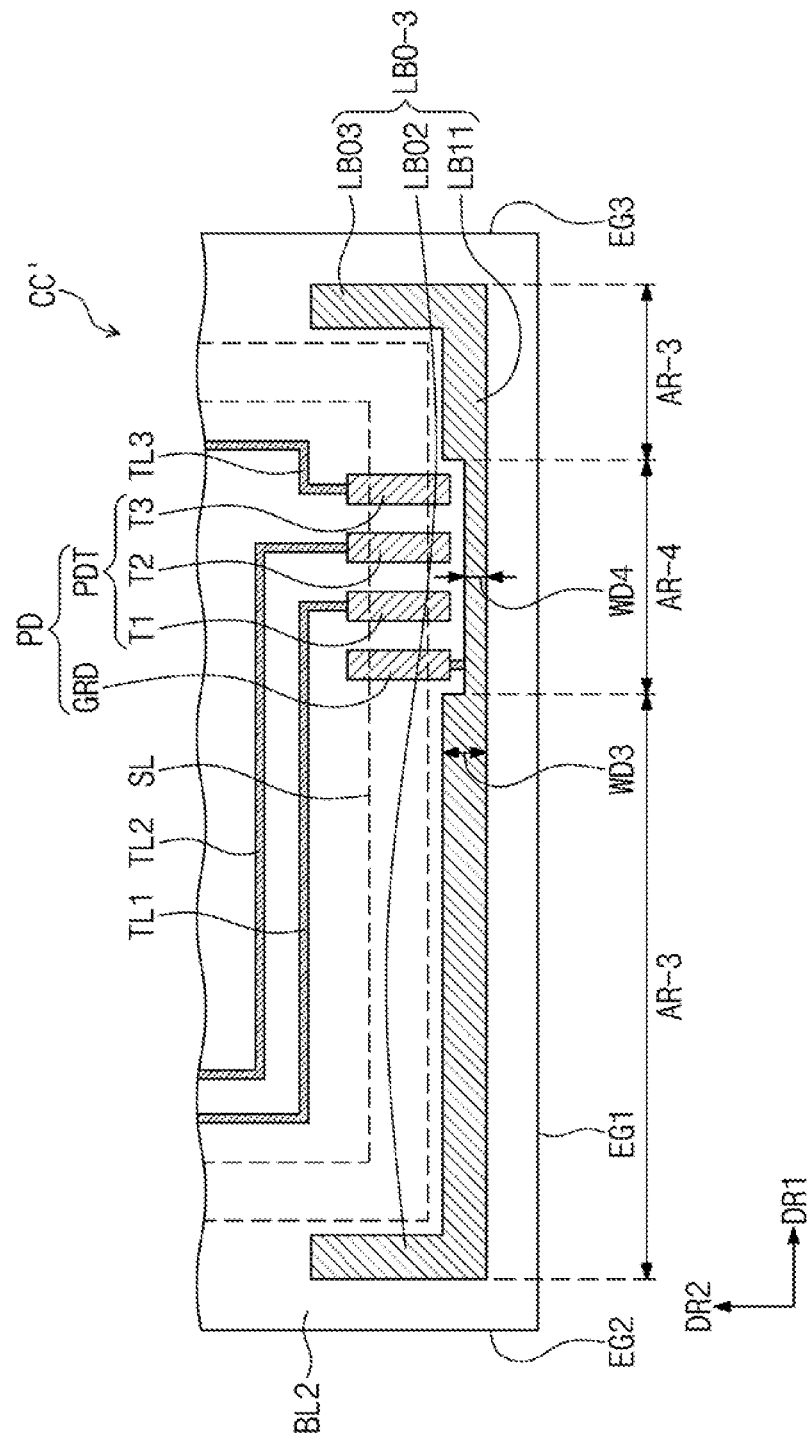
FIG. 12 is a plan view illustrating region CC' shown in FIG. 5, according to an exemplary embodiment of the present invention.

FIG. 12 is a plan view illustrating a region corresponding to region CC' shown in FIG. 5, according to an exemplary embodiment of the present invention. The same reference numerals are given to the elements described with reference to FIG. 7 to FIG. 11, and the descriptions thereof may be omitted.

Referring to FIG. 12, a blocking unit LB0-3 may include a first blocking unit LB11, the second blocking unit LB02, and the third blocking unit LB03.

The first blocking unit LB11 may extend in the first direction DR1. The first blocking unit LB11 may include a first end portion and a second end portion. The second blocking unit LB02 may extend in the second direction (e.g., the DR2 direction) from the first end portion. The third blocking unit LB03 may extend in the second direction (e.g., the DR2 direction) from the second end portion.

The first blocking unit LB11 may include a first region AR-3 and a second region AR-4. A width WD3 of the first region AR-3 may be greater than a width WD4 of the second region AR-4. The width WD3 of the first region AR-3 and the width WD4 of the second region AR-4 may refer to widths in the second direction (e.g., the DR2 direction). The second region AR-4 may face the sensing pads PDT.

The first blocking unit LB11 may be spaced apart from the signal lines TL1, TL2, and TL3 with the sensing pads PDT interposed therebetween. Between the blocking unit LB0-3 and the signal lines TL1, TL2, and TL3, the coupling unit SL may be disposed. When viewed in a plan view, the blocking unit LB0-3 might not overlap the coupling unit SL. The blocking unit LB0-3 may be connected to the ground pad GRD.

The blocking unit LB0-3 may accommodate an area of a region in which the signal pad PD is disposed due to the difference between the width WD3 of the first region AR-3 and the width WD4 of the second region AR-4. Accordingly, even when the blocking unit LB0-3 of the display device EA is included, an increase in the area of the non-display area NAA may be minimized.

According to the present invention and exemplary embodiments described heretofore, a display device may include a blocking unit for blocking laser light from irradiating regions other than the coupling unit during a manufacturing process. The blocking unit may be spaced apart from signal lines with sensing pads connected to the signal lines interposed therebetween. The blocking unit may be connected to at least one ground pad. The blocking unit may prevent an organic film of the display device from being damaged by the laser light, thereby increasing efficiency of manufacture, reducing concomitant costs, and increasing reliability.

Static electricity introduced from the outside may be transferred to a ground pad through the blocking unit. Since the blocking unit is spaced apart from the signal lines, the static electricity may be prevented from damaging the signal lines. Accordingly, the present invention provides for a display device with increased reliability.

While the exemplary embodiments of the present invention have been shown and described above, it will be understood by one of ordinary skill in the art that modifications and variations in form and detail may be made therein without departing from the spirit and scope of the present invention.

What is claimed is:

1. A display device, comprising:
a first substrate;
a second substrate disposed on the first substrate and including a first surface that faces the first substrate and a second surface opposite to the first surface that faces away from the first substrate;
a display unit disposed between the first substrate and the second substrate;
a coupling unit disposed between the first substrate and the first surface of the second substrate;
a plurality of input sensing electrodes disposed on the second surface of the second substrate;
a plurality of signal lines disposed on the second surface of the second substrate;
a plurality of sensing pads disposed on the second surface of the second substrate, at least partially overlapping the coupling unit when viewed in a plan view, and connected to the signal lines; and a blocking unit disposed on the second surface of the second substrate and spaced apart from the signal lines with the sensing pads interposed therebetween when viewed in the plan view, wherein the second substrate is disposed between the plurality of sensing pads and the coupling unit, and wherein a width of the blocking unit is smaller in a region proximate to the sensing pads and larger in a region farther away from the sensing pads.

2. The display device of claim 1, wherein the coupling unit is disposed between the blocking unit and the plurality of signal lines when viewed in the plan view.

3. The display device of claim 1, wherein the sensing pads are spaced in a first direction, and the blocking unit has a length that extends primarily in the first direction.

4. The display device of claim 1, further comprising at least one ground pad, wherein the blocking unit is connected to the ground pad.

5. The display device of claim 1, wherein the coupling unit does not overlap the blocking unit when viewed in the plan view.

6. The display device of claim 1, further comprising at least one protruding portion protruding from at least one end of the blocking unit to a first edge of the second substrate.

7. The display device of claim 1, wherein the sensing pads are spaced in a first direction, and the blocking unit comprises:
a first blocking unit extending primarily in the first direction and having a first end portion and a second end portion;
a second blocking unit extending from the first end portion primarily in a second direction crossing the first direction; and
a third blocking unit extending from the second end portion primarily in the second direction.

8. The display device of claim 7, further comprising at least one protruding portion protruding from each of the first end portion and the second end portion of the blocking unit toward a first edge of the second substrate.

9. The display device of claim 7, further comprising:
at least one first protruding portion protruding from the second blocking unit toward a second edge of the second substrate; and
at least one second protruding portion protruding from the third blocking unit toward a third edge of the second substrate.

10. The display device of claim 1, wherein the display unit comprises a display region and a non-display region adjacent to the display region, and the blocking unit at least partially overlaps the non-display region when viewed in the plan view.

11. The display device of claim 1, wherein
the input sensing electrodes comprise a first sensing electrode and a second sensing electrode, and
the first sensing electrode includes first electrodes and at least one first connecting electrode that connects two adjacent first electrodes, and the second sensing electrode includes second electrodes and at least one second connecting electrode that connects two adjacent second electrodes,
wherein the first connecting electrode and the second connecting electrode are disposed on different layers.

12. The display device of claim 11, wherein the blocking unit is disposed on a same layer as the first connecting electrodes or the second connecting electrodes.

13. A display device, comprising:
a first substrate;
a second substrate facing the first substrate and including a first surface and a second surface opposite to the first surface;
a coupling unit disposed between the first substrate and the second substrate and coupled to the first substrate and the first surface of the second substrate;
a plurality of input sensing electrodes disposed directly on the second surface of the second substrate;
a plurality of signal lines disposed on the second surface of the second substrate and connected to the input sensing electrodes;
a plurality of signal pads disposed on the second surface of the second substrate, at least partially overlapping the coupling unit when viewed in a plan view, and including a plurality of sensing pads connected to the signal lines and at least one ground pad, wherein the second substrate separates the coupling unit from the plurality of sensing pads; and
a blocking unit disposed directly on the second surface of the second substrate, spaced apart from the signal lines with the signal pads interposed therebetween when viewed in the plan view, and connected to the at least one ground pad,
wherein a width of the blocking unit is smaller in a region proximate to the plurality of signal pads and larger in a region farther away from the signal pads.

14. The display device of claim 13, further comprising at least one protruding portion protruding from ends of the blocking unit to a first edge of the second substrate.

* * * * *